METHOD OF FORMING SEMICONDUCTOR DEVICE WITH SMOOTH FLAT SURFACE

Filed June 18, 1971

INVENTORS
Frank Z. Hawrylo &
Henry Kressel
BY Donald S. Cohen
ATTORNEY

United States Patent Office 3,692,593
Patented Sept. 19, 1972

3,692,593

METHOD OF FORMING SEMICONDUCTOR DEVICE WITH SMOOTH FLAT SURFACE

Frank Zygmunt Hawrylo, Trenton, and Henry Kressel, Elizabeth, N.J., assignors to RCA Corporation Filed June 18, 1971, Ser. No. 154,553
Int. Cl. H01l 7/38
U.S. Cl. 148—172 9 Claims

ABSTRACT OF THE DISCLOSURE

An epitaxial layer of single crystalline gallium arsenide or aluminum gallium arsenide having a low concentration of aluminum is deposited on a body of single crystalline semiconductor material by liquid phase epitaxy. An additional layer of single crystalline aluminum gallium arsenide having a relatively high concentration of aluminum is deposited by liquid phase epitaxy on the epitaxial layer. The additional layer is then completely etched away by an etchant which does not attack the material of the epitaxial layer, such as boiling hydrochloric acid, to expose the entire surface of the epitaxial layer and provide the epitaxial layer with a smooth, flat surface.

BACKGROUND OF THE INVENTION

The present invention relates to a method of forming a semiconductor device with a smooth, flat surface. More particularly, the present invention relates to a method of forming by liquid phase epitaxy a semiconductor device which includes an epitaxial layer having a smooth, flat surface.

A technique which has come into use for making certain types of semiconductor devices, particularly semiconductor devices made of the Group III–V semiconductor materials, such as light emitting devices and transferred electron devices, is known as "liquid phase epitaxy." Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

U.S. Pat. No. 3,565,702 to H. Nelson, issued Feb. 23, 1971 entitled "Depositing Successive Epitaxial Semiconductive Layers From The Liquid Phase" describes a method and apparatus for depositing one or more epitaxial layers by liquid phase epitaxy and is particularly useful for depositing a plurality of epitaxial layers in succession. The apparatus includes a furnace boat of a refractory material having a plurality of spaced wells in its top surface and a slide of a refractory material movable in a passage which extends across the bottoms of the wells. In the use of this apparatus, a solution is provided in a well and a substrate is placed in a recess in the slide. The slide is then moved to bring the substrate into the bottom of the well so that the surface of the substrate is brought into contact with the solution. When the epitaxial layer is deposited on the substrate, the slide is moved to carry the substrate out of the well. To deposit a plurality of epitaxial layers on the substrate, separate solutions are provided in separate wells and the substrate is carried by the slide to each of the wells in succession to deposit the epitaxial layers on the substrate.

Although the method and apparatus of Pat. No. 3,565,702 is quite satisfactory for depositing epitaxial layers by liquid phase epitaxy, it has been found to have a disadvantage. When the slide is moved to carry the substrate from a well after the deposition of an epitaxial layer, a thin film of the solution in the well is retained on the surface of the epitaxial layer and is carried with the substrate. As stated in the patent, when the substrate is being carried to another well for the deposition of another epitaxial layer, the thin film of the solution from the previous well has certain beneficial effects. However, it has been found that when the substrate is carried out of the last well after depositing the last epitaxial layer, the thin film of the solution retained on the surface of the last epitaxial layer tends to randomly deposit some semiconductor material on the surface of the last epitaxial layer as the substrate is cooled. This random deposition provides the last epitaxial layer with a rough surface. Such a rough surface is undesirable, particularly when the semiconductor device is to be mounted with the epitaxial layer engaging a heat sink member for the purpose of removing heat from the semiconductor device during its operation. A rough surface provides uneven contact between the epitaxial layer and the heat sink member so that there is poor transfer of heat to the heat sink member. However, a smooth, flat surface would provide uniform contact with the heat sink member over the entire area of the surface of the epitaxial layer to achieve good transfer of heat.

To provide the epitaxial layer with a smooth, flat surface attempts have been made to polish the surface of the epitaxial layer either mechanically or chemically. However, it has been found that mechanically polishing the surface of the epitaxial layer creates mechanical defects in the epitaxial wafer. These mechanical defects tend to propagate through the epitaxial layer and adversely affect the electrical characteristics of the semiconductor device, particularly when the epitaxial layer is relatively thin. Although chemical polishing forms a smooth surface, it is difficult to control and it has been found that it tends to form a slightly rounded surface rather than a flat surface. Therefore, it is desirable to be able to form an epitaxial layer by liquid phase epitaxy which has a smooth, flat surface.

SUMMARY OF THE INVENTION

An epitaxial layer of single crystalline semiconductor material having a smooth flat surface is formed by first depositing the epitaxial layer. An additional layer of a single crystalline semiconductor material which can be removed by an etchant which will not etch the material of the epitaxial layer and which has a crystalline lattice which substantially matches that of the epitaxial layer is then deposited on the epitaxial layer. All of the additional layers are then etched away by an etchant which does not etch the epitaxial layer to expose the surface of the epitaxial layer.

DETAILED DESCRIPTION

Figure 1:
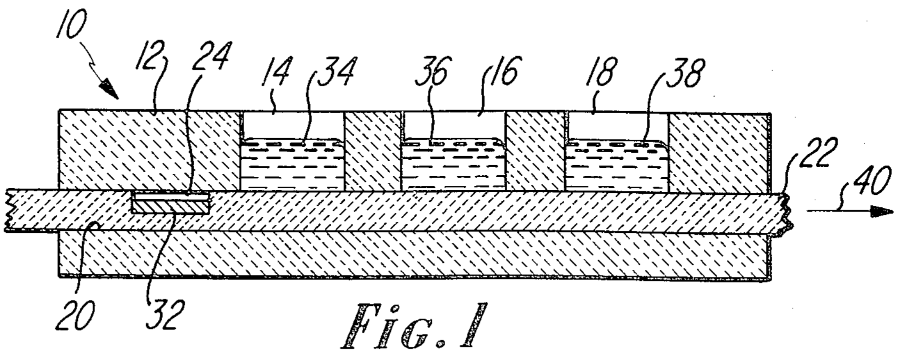
FIG. 1 is a sectional view of an apparatus which is suitable for carrying out the method of the present invention.

Referring initially to FIG. 1, a form of an apparatus for carrying out the method of the present invention is generally designated as 10. The apparatus 10 comprises a furnace boat 12 of an inert refractory material, such as graphite. The furnace 12 has three wells 14, 16 and 18 in its upper surface, and a passage 20 extending longitudinally therethrough. The passage 20 extends across the bottoms of the wells 14, 16 and 18. A movable slide 22 of a refractory material extends through the passage 20. The slide 22 has a recess 24 in its top surface adjacent one end of the slide. The recess 24 is of a size and shape to receive a substrate 32 with the substrate lying flat in the recess. However, the depth of the recess is greater than the thickness of the substrate so that the top surface of the substrate is below the top of the recess.

Figure 5:
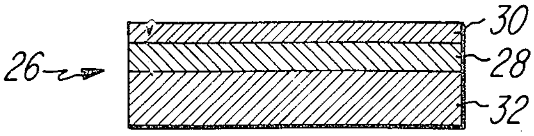

For illustrative purposes, the method of the present invention will be described with regard to making a light emitting semiconductor diode 26 shown in FIG. 5 having two superimposed epitaxial layers 28 and 30 on a substrate 32. The substrate 32 is of N-type gallium arsenide. The first epitaxial layer 28 is of P-type aluminum gallium arsenide and the second epitaxial layer 30, which is to have a smooth, flat surface, is of P-type gallium arsenide.

To make the light emitting diode 26 in the apparatus 10 according to the method of the present invention, the substrate 32 is seated in the recess 24 in the slide 22, a first charge is introduced into the well 14, a second charge is introduced into the well 16 and a third charge is introduced into the well 18. The first charge is a mixture of gallium as a metal solvent, gallium arsenide, aluminum and a P-type conductivity modifier such as zinc. The second charge is a mixture of gallium, gallium arsenide and a P-type conductivity modifier such as zinc. The third charge is a mixture of gallium, gallium arsenide and aluminum. The third charge contains about 1% by weight of the aluminum. The ingredients of the charges may be in granulated solid form at room temperature.

The loaded furnace boat 12 is then positioned in a furnace tube (not shown) and a flow of high purity hydrogen is provided through the furnace tube and over the furnace boat 12. The heating means of the furnace tube is turned on to heat the furnace boat 12 and its contacts to a temperature at which the ingredients of the charges in the wells of the furnace boat become molten, generally between 800° C. and 950° C. At this temperature, the first charge becomes the first solution 34 consisting of gallium arsenide, aluminum and zinc dissolved in molten gallium. The second charge becomes the second solution 36 consisting of gallium arsenide and zinc dissolved in molten gallium. The third charge becomes the third solution 38 consisting of gallium arsenide and aluminum dissolved in molten gallium. The furnace tube is maintained at this temperature for a time sufficient to permit complete melting of the charges and complete mixing of the solutions. The heating means for the furnace tube is then turned off to allow the furnace boat 12 and its contents to cool.

Figure 2:
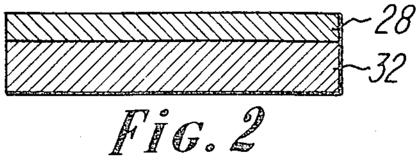
FIGS. 2–5 are sectional views of a semiconductor device illustrating the various steps of the method of the present invention.

The slide 22 is then moved in the direction of the arrow 40 in FIG. 1 to move the substrate 32 into the first well 14 so that the surface of the substrate is brought into contact with the first solution 34. As the first solution 34 continues to cool, some of the gallium arsenide in the solution precipitates and deposits on the substrate 32 to form the first epitaxial layer 28 as shown in FIG. 2. Some of the aluminum in the first solution 34 becomes incorporated in the first epitaxial layer 28 and replaces some of the gallium ions so that the first epitaxial layer may be regarded as an alloy of gallium arsenide and aluminum arsenide or as the mixed semiconductor, aluminum gallium arsenide, having the formula $$Ga_{1-x}Al_xAs$$

where $x$ is less than 1. Also, some of the zinc in the first solution is incorporated in the crystal lattice of the first epitaxial layer 28 so that the first epitaxial layer is of P-type conductivity.

Figure 3:
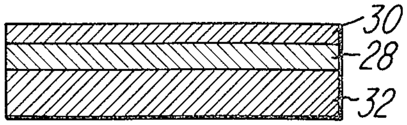

When the first epitaxial layer 28 is of the desired thickness, the slide 22 is again moved in the direction of the arrow 40 to move the substrate 32 from the first well 14 into the second well 16. When the substrate 32 reaches the second well 16, the first epitaxial layer 28 is brought into contact with the second solution 36. Further cooling of the second solution 36 causes some of the gallium arsenide in the second solution to precipitate and deposit on the first epitaxial layer 28 to form the second epitaxial layer 30 as shown in FIG. 3. Some of the zinc in the second solution 36 becomes incorporated in the lattice structure of the second epitaxial layer 30 so that the second epitaxial layer 30 is of P-type conductivity.

Figure 4:
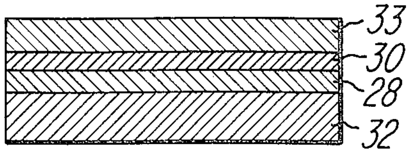

When the second epitaxial layer 30 is of the desired thickness, the slide is again moved in the direction of the arrow 40 to move the substrate 32 from the second well 16 into the third well 18. When the substrate 32 reaches the third well 18, the second epitaxial layer is brought into contact with the third solution 38. Further cooling of the third solution 38 causes some of the gallium arsenide in the third solution to precipitate and deposit on the second epitaxial layer 30 to form a third epitaxial layer 33 as shown in FIG. 4. Some of the aluminum in the third solution becomes incorporated in the third epitaxial layer 33 and replaces some of the gallium ions so that the third epitaxial layer is aluminum, gallium arsenide. Because of the concentration of the aluminum in the third solution, the aluminum, gallium arsenide of the third epitaxial layer has the formula $Ga_{1-x}Al_xAs$, where $x$ is greater than about 0.3 but less than 1. After the third epitaxial layer 33 is deposited, the slide 22 is again moved in the direction of the arrow 40 to remove the substrate from the third well 18 and permit the coated substrate to be removed from the slide.

The third epitaxial layer 33 is then removed by an etchant which will not attack the second epitaxial layer 30. Boiling hydrochloric acid will etch aluminum gallium arsenide which has a relatively high concentration of aluminum, i.e. $Ga_{1-x}Al_xAs$ where $x$ is greater than about 0.3 but less than 1, but will not attack either gallium arsenide or aluminum gallium arsenide having a relatively low concentration of aluminum, i.e. $Ga_{1-x}Al_xAs$ where $x$ is less than 0.3. Thus, by immersing the third epitaxial layer 33 in boiling hydrochloric acid the third epitaxial layer 33 is etched away exposing the surface of the second epitaxial layer 30 to provide the semiconductor device 26 shown in FIG. 5. It has been found that when the third epitaxial layer 33 is so removed, the exposed surface of the second epitaxial layer is smooth and flat and requires no further polishing.

Although the method of the present invention has been described with regard to forming a light-emitting semiconductor device having two epitaxial layers on a substrate, it can be used to form any type of semiconductor device one or more epitaxial layers deposited by liquid phase epitaxy. To make any such semiconductor device, after the last epitaxial layer required by the structure of the semiconductor device is deposited, an additional layer is deposited by liquid phase epitaxy on the last epitaxial layer. The additional layer is of a semiconductor material which can be removed by an etchant which will not etch the material of the last epitaxial layer and which has a crystalline lattice which substantially matches that of the last epitaxial layer. All of the additional layer is then etched away with the etchant which does not etch the last epitaxial layer to expose the surface of the last epitaxial layer. The surface of the last epitaxial layer will be smooth and flat so as not to require any polishing. Thus, there is provided by the present invention a method of making semiconductor devices by liquid phase epitaxy with the surface of the last epitaxial layer of the device being smooth and flat.

We claim:

1. A method of forming an epitaxial layer of single crystalline semiconductive material with a smooth flat surface comprising the steps of (a) depositing said epitaxial layer, (b) depositing on said epitaxial layer an additional layer of a single crystalline semiconductor material which can be removed by an etchant which will not etch the material of the epitaxial layer and which has a crystalline lattice which substantially matches that of the epitaxial layer, and (c) etching away all of said additional layer by an etchant which does not etch the epitaxial layer to expose the surface of the epitaxial layer.

2. The method of claim 1 wherein the epitaxial layer is single crystalline gallium arsenide or an alloy thereof.

3. The method of claim 2 wherein the additional layer is single crystalline aluminum gallium arsenide.

4. The method of claim 3 wherein the material of the epitaxial layer is gallium arsenide or aluminum gallium arsenide having a concentration of aluminum substantially less than the concentration of aluminum in the additional layer.

5. The method of claim 4 wherein the additional layer is etched with hydrochloric acid.

6. The method of claim 1 wherein the epitaxial layer is deposited on a body of single crystalline semiconductor material and the epitaxial layer and the additional layer are deposited by liquid phase epitaxy.

7. The method of claim 6 wherein the epitaxial layer is deposited on the body by bringing a surface of the body into contact with a solution of gallium arsenide dissolved in molten gallium and cooling the solution to deposit a layer of single crystalline gallium arsenide on the surface of the body.

8. The method of claim 7 wherein the additional layer is deposited on the epitaxial layer by bringing the surface of the epitaxial layer into contact with a solution of gallium arsenide and aluminum dissolved in molten gallium and cooling the solution to deposit a layer of single crystalline aluminum gallium arsenide on the epitaxial layer.

9. The method of claim 8 wherein the solutions for depositing the epitaxial layer and the additional layer are contained in separate wells in a refractory furnace boat and the body is carried by a movable slide which extends across the bottoms of the wells first into one of the wells where the epitaxial layer is deposited on the body and then into the other well where the additional layer is deposited on the epitaxial layer.

References Cited

UNITED STATES PATENTS

| | | | |
|---|---|---|---|
| 3,429,756 | 2/1969 | Groves | 148—1.6 X |
| 3,537,029 | 10/1970 | Kressel et al. | 148—171 UX |
| 3,565,702 | 2/1971 | Nelson | 148—172 |

GEORGE T. OZAKI, Primary Examiner

U.S. Cl. X.R.

148—171; 117—201; 252—62.3 GA